Nov. 4, 1969 J. E. ZIDO ET AL 3,476,987

RESIN ENCAPSULATED SEMICONDUCTOR DEVICE

Filed Sept. 27, 1967

WITNESSES

Theodore F. Wrobel

James F. Young

INVENTORS
Joseph E. Zido
and Thomas A. Whalen
BY
C. L. Menzemer
ATTORNEY

United States Patent Office 3,476,987
Patented Nov. 4, 1969

3,476,987
RESIN ENCAPSULATED SEMICONDUCTOR DEVICE

Joseph E. Zido, Donora, and Thomas A. Whalen, Irwin, Pa., assignors to Westinghouse Electric Corporation, Pittsburgh, Pa., a corporation of Pennsylvania
Filed Sept. 27, 1967, Ser. No. 671,017
Int. Cl. H01l 3/00, 5/00
U.S. Cl. 317—234 4 Claims

ABSTRACT OF THE DISCLOSURE

This disclosure sets forth a resin encapsulated semiconductor device in which the wafer of semiconductor material has been etched in such a manner as to preclude the need of a cushioning material being disposed between the wafer and the encapsulating resin.

Background of the invention

This invention relates to a junction-type diode encapsulated and hermetically sealed within a body of a cured resin.

In prior art devices it has been found necessary to first surround the wafer of semiconductor material with a coating of a cushioning material before encapsulation to prevent the resin used for encapsulation from damaging the wafer.

An object of the present invention is to provide a junction-type diode device comprising a wafer of semiconductor material which is encapsulated and hermetically sealed within and by a cured body of a resinous material and which does not have a layer or body of a cushioning material disposed about the wafer of semiconductor material.

Other objects will, in part, appear hereinafter and will, in part, be obvious.

Summary of the invention

This invention provides a junction-type diode consisting of only a wafer of semiconductor material, said wafer having substantially parallel top and bottom surfaces and side walls, a p-n junction disposed therein, a region of a first-type of semiconductivity extending from said top surface to said p-n junction, a region of a second-type of semiconductivity extending from said bottom surface to said p-n junction, said p-n junction intersecting said side walls of said wafer, said side walls of said wafer being concaved inward toward the center of said wafer, metal electrical contacts affixed to the top and to the bottom surfaces of said wafer, an electrical lead affixed at one end to each of the metal electrical contacts, and a body of a cured resin disposed about and completely encapsulating said wafer, said contacts and a portion of said leads.

Description of the preferred embodiments

Figure 1:
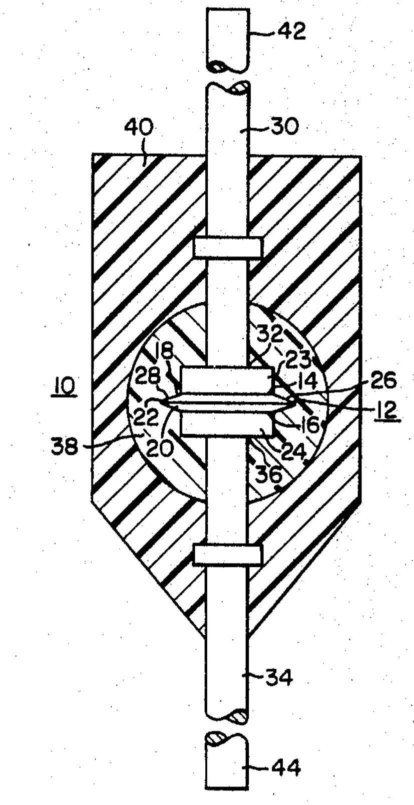
FIG. 1. PRIOR ART
FIG. 1 is a side-view in cross-section of a prior art device.

With reference to FIG. 1, there is shown a semiconductor device 10 prepared in accordance with the prior art.

The device 10 consists of a wafer 12 of a semiconductor material as for example, silicon. The wafer 12 has a top surface 14 and a bottom surface 16. The wafer 12 has a region 18 of a first-type of semiconductivity and a region 20 of a second-type of semiconductivity. There is a p-n junction 22 disposed between regions 18 and 20.

The top surface 14 and the bottom surface 16 of the wafer 12 are substantially parallel.

A first metal electrical contact 23, as for example molybdenum, tantalum or tungsten, is affixed to top surface 14 of the wafer 12 and a second metal electrical contact 24 is affixed to bottom surface 16 of the wafer 12.

An electrical lead 30 is joined by soldering end 32 of the lead 30 to contact 23 and a second electrical lead 34 is joined to contact 24 by soldering end 36 of lead 34 to contact 24.

Sides 26 and 28 of the wafer 12 extend beyond the perimeter of the contacts and as a result of etching are thin and fragile at the extremities.

To prevent the extremities of the wafer 12 from cracking from the stresses which bear on the wafer during encapsulation a coating 38 of a cushioning material, for example a silicone resin is disposed entirely about the wafer 12 and the contacts 22 and 24.

The device is then disposed in a mold and a body 40 of an epoxy resin is disposed about the assembly and cured in place. It will be understood of course that ends 42 and 44 of leads 30 and 32 respectively extend beyond the cured body 40 to facilitate making electrical contact to the device.

The body 40 is comprised of an epoxy resin which is substantially impervious to moisture and exhibits little or no shrinkage when heated to a high temperature.

It has now been discovered that a device may be encapsulated in a body of epoxy resin without employing a cushioning material.

Figure 2:
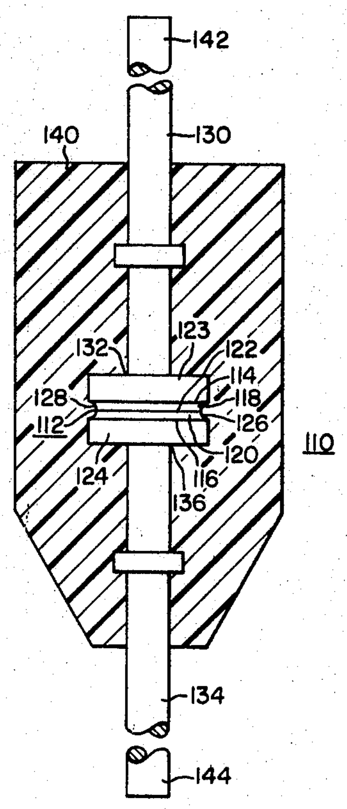
FIG. 2 is a side-view in cross-section of a resin encapsulated diode prepared in accordance with the teach ings of this invention.

With reference to FIG. 2 there is shown a device 110 prepared in accordance with the teachings of this invention.

The device 110 consists only of a wafer 112 of a semiconductor material as for example silicon. The wafer 112 has a top surface 114 and a bottom surface 116. The surfaces 114 and 116 are substantially parallel.

The wafer 112 has a region 118 of a first-type of semiconductivity and a region 120 of a second-type of semiconductivity. There is a p-n junction 122 disposed between regions 118 and 120.

A first metal electrical contact 123 is affixed to the top surface 114 of the wafer 112 and a second metal electrical contact 124 is affixed to bottom surface 16 of the wafer 112. The metal contacts consist of a metal selected from the group consisting of molybdenum, tungsten, tantalum and base alloys thereof.

An electrical lead 130 is joined by soldering end 132 of the lead 130 to contact 123 and a second electrical lead 134 is joined to contact 124 by soldering end 136 of lead 134 to contact 124.

Sides 126 and 128 of the wafer 112 rather than extending beyond the perimeter of the contacts 123 and 124 as in the prior art, have been etched after the wafer 112 has been joined to the contacts 123 and 124 and the sides 126 and 128 of the wafer 112 are concave inward toward the center of the wafer.

By concaving the sides 126 and 128 inward the wafer 112 is less susceptible to stresses and thus can be encapsulated within a body 140 of a cured epoxy resin without employing any cushioning means as is required in prior art devices.

The epoxy resin employed to form the body 140 is substantially impervious to moisture and exhibits substantially no shrinkage when heated to high temperature. One suitable epoxy resin is that sold by Pacific Chemical and Resin under the designation EMC 90.

Ends 142 and 144 of leads 130 and 134 extend beyond the body 140 to facilitate making electrical contact to the device 110.

While the invention has been described with reference to particular embodiments and examples it will be understood, of course, that modifications, substitutions and the ike may be made without departing from its scope.

We claim as our invention:

1. A semiconductor device consisting of only:

(1) A wafer of semiconductor material, and wafer having substantially parallel top and bottom surfaces and side walls, a p-n junction disposed therein, a region of a first-type of semiconductivity extending from said top surface to said p-n junction, a region of a second-type of semiconductivity extending from said bottom surface to said p-n junction, the side walls of said wafer being concaved inward toward the center of said wafer, (2) Metal electrical contacts affixed to the top and to the bottom surfaces of said wafer, (3) An electrical lead affixed at one end to each of the metal electrical contacts, and (4) A body of a cured resin disposed about and completely encapsulating said wafer, said contacts and a portion of said leads.

2. The device of claim 1 in which the other end of the electrical leads extend beyond the body of cured resin.

3. The device of claim 2 in which the body of cured resin is comprised of an epoxy resin.

4. The device of claim 3 in which the electrical contacts consist of a metal selected from the group consisting of molybdenum, tungsten, tantalum and base alloys thereof.

References Cited

UNITED STATES PATENTS 3,237,272 3/1966 Kallander -------- 317—234 X

JOHN W. HUCKERT, Primary Examiner

R. F. POLISSACK, Assistant Examiner

U.S. Cl. X.R.

317—235